United States Patent [19]

Komiyama et al.

[11] Patent Number: 5,356,949
[45] Date of Patent: Oct. 18, 1994

[54] ADHESIVE COMPOSITION COMPRISING (METH)ACRYLATE POLYMER AND EPOXY RESIN

[75] Inventors: Mikio Komiyama, Yokohama; Yasunao Miyazawa, Urawa; Kazuyoshi Ebe, Minamisaitama; Takanori Saito, Ohmiya, all of Japan

[73] Assignee: Lintec Corporation, Tokyo, Japan

[21] Appl. No.: 837,117

[22] Filed: Feb. 21, 1992

Related U.S. Application Data

[62] Division of Ser. No. 653,232, Feb. 8, 1991, Pat. No. 5,110,388, which is a division of Ser. No. 380,548, Jul. 14, 1989, Pat. No. 5,118,567.

[30] Foreign Application Priority Data

Jul. 21, 1988 [JP] Japan ................... 63-183158

[51] Int. Cl.$^5$ .............. C08F 2/50; C09J 4/06; C09J 163/02; C09J 133/06
[52] U.S. Cl. ................... 522/102; 522/103; 522/109; 525/112
[58] Field of Search ............ 522/109, 102, 95, 103; 525/112

[56] References Cited

U.S. PATENT DOCUMENTS

| | | | |
|---|---|---|---|
| 4,218,279 | 8/1980 | Green | 428/345 |
| 4,286,047 | 8/1981 | Bennett | 428/345 |
| 4,485,166 | 11/1984 | Herwig et al. | 522/95 |
| 4,601,973 | 7/1986 | Bauer | 522/109 |
| 4,664,239 | 5/1987 | Aurichio | 156/344 |
| 4,687,693 | 8/1987 | Sheyon et al. | 428/148 |
| 4,688,053 | 8/1987 | Noguchi et al. | 522/102 |
| 4,698,113 | 10/1987 | Ogawa | 156/272.2 X |
| 4,756,968 | 7/1988 | Ebe | 428/345 |
| 4,793,883 | 12/1988 | Sweynn et al. | 156/249 |
| 4,839,400 | 6/1989 | Sato et al. | 522/102 |
| 4,913,960 | 4/1990 | Kuroda | 428/345 |
| 4,920,317 | 1/1988 | Kuroda et al. | 156/242.2 X |
| 4,959,008 | 9/1990 | Wasulko | 428/40 |
| 4,961,804 | 10/1990 | Aurichio | 156/344 X |
| 4,996,132 | 2/1991 | Tazawa et al. | 522/102 |
| 5,030,308 | 7/1991 | Sheyon et al. | 156/235 |
| 5,049,434 | 9/1991 | Wasulko | 428/202 |
| 5,068,259 | 11/1991 | Noguchi | 522/109 |

FOREIGN PATENT DOCUMENTS

| | | | |
|---|---|---|---|
| 0157508 | 10/1985 | European Pat. Off. | |
| 0307919 | 3/1989 | European Pat. Off. | 522/109 |
| 0221477 | 11/1985 | Japan | 428/345 |
| 1028572 | 2/1986 | Japan | 428/345 |
| 3027580 | 2/1988 | Japan | 428/345 |

Primary Examiner—Susan W. Berman
Attorney, Agent, or Firm—Wenderoth, Lind & Ponack

[57] ABSTRACT

An adhesive tape comprising an energy beam transmittable base sheet having a surface tension of not more than 40 dyne/cm and an adhesive layer formed on one surface of the base sheet, the adhesive layer comprising a (meth)acrylate polymer, an epoxy resin, a photopolymerizable low molecular weight compound, a heat activatable latent curing agent for the epoxy resin and a photopolymerization initiator for the photopolymerizable low molecular weight compound. The adhesive in the adhesive layer is curable with an energy beam and the so cured adhesive develops tackiness again when heated. When the tape is used in processing a semiconductor wafer, it serves as a dicing tape for holding the wafer in position during the dicing step. Each piece of the diced and cured adhesive layer, that is attached to each chip and capable of being tackified by heating, provides an adhesive required for securely mounting the chip on the lead frame in the die-bonding step.

1 Claim, 2 Drawing Sheets

ADHESIVE COMPOSITION COMPRISING (METH)ACRYLATE POLYMER AND EPOXY RESIN

This application is a division of Ser. No. 07/653,232 filed Feb. 8, 1991, now U.S. Pat. No. 5,110,388, which is a division of Ser. No. 07/380,548 filed Jul. 14, 1989, now U.S. Pat. No. 5,118,567.

FIELD OF THE INVENTION

The present invention relates to a novel adhesive tape and use thereof. More particularly, it relates to an adhesive tape suitable for use in dicing a semiconductor wafer into chips and die-bonding the chips on a lead frame, and to use of such an adhesive tape.

BACKGROUND OF THE INVENTION

Wafers of semiconductor material such as silicon and gallium-arsenic having formed thereon integrated circuits have a relatively large diameter. In the production of integrated circuits (IC), such a wafer is adhered to an adhesive tape sometimes called a dicing tape, diced into chips (IC chips), which are then released (picked up) from the dicing tape, and adhered to (mounted on) a lead frame by means of an adhesive such as an epoxy resin.

For dicing tapes suitable for use in such a wafer processing technique, is required that they should exhibit a strong adhesion to the semiconductor wafer in the step of dicing the wafer into IC chips on the one hand, while they should also have such a reduced adhesion to the IC chips in the step of picking up the IC chips so that the IC chips may be readily released without carrying adhesive residues from the dicing tapes. Thus, in prior art dicing tapes adhesive and releasing properties, which are conflicting, are required, and use of a dicing tape whose adhesive and releasing properties are not well balanced in wafer processing, invites such a problem that the dicing and/or picking up steps of the process cannot be smoothly carried out. In particular, when a prior art dicing tape is used in wafer processing, a part of the adhesive of the dicing tape is transferred to the picked up IC chips and adversely affects the characteristics of the resulting IC. Accordingly, it has been necessary to remove the undesirable residual adhesive from the IC chips before they are mounted on a lead frame. While complete removal of the residual adhesive is difficult, the step of removing the adhesive not only makes the processing complicated, but also invites a problem of environmental pollution if an organic solvent is used, for the removal of the residual adhesive.

Furthermore, a separate adhesive such as an epoxy resin has been used for mounting the IC chips on a lead frame, as described in Japanese Patent Laid-open Publication No. 60-198,757. The use of a separate adhesive involves another problem such that unceasing application of appropriate amounts of the adhesive is technically very difficult, which results in a case of a very small. IC chip in the applied adhesive frequently bulging out of the chip, whereas in a case of a relatively large IC chip, the amount of the applied adhesive tends to be too small to provide a desired adhesion.

OBJECT OF THE INVENTION

The invention intends to solve the above-discussed problems associated with the prior art and an object of the invention is to provide an adhesive tape suitable for use in processing semiconductor wafers which has both actinic radiation curability and heat curability, which can be used as a dicing tape in the dicing step and which can provide an adhesive in the mounting step.

SUMMARY OF THE INVENTION

In accordance with one aspect of the invention there is provided an adhesive tape comprising an energy beam transmittable base sheet having a surface tension of not more than 40 dyne/cm and an adhesive layer formed on one surface of said base sheet, said adhesive layer comprising a (meth)acrylate polymer, an epoxy resin, a photopolymerizable low molecular weight compound, a heat activatable latent curing agent for said epoxy resin and a photopolymerization initiator for said photopolymerizable low molecular weight compound.

In accordance with another aspect of the invention there is provided a method for using the abovementioned adhesive tape, which method comprises the steps of adhering a semiconductor wafer to said adhesive tape, dicing said wafer into chips together with the adhesive layer of said adhesive tape, irradiating the adhesive layer of said tape with an energy beam, picking up the chips together with pieces of the diced adhesive layer adhered thereto from said base sheet, placing the chips on a lead frame so that the respective pieces of the adhesive layer may come in contact with said lead frame, and causing the pieces of the diced adhesive layer to again develop tackiness by heating thereby securely mounting the chips on said lead frame.

In the method according to the invention, the adhesive tape according to the invention serves as a dicing tape for holding the wafer in position during the dicing step. Each piece of the diced and cured adhesive layer, that is attached to each chip and capable of being tackified by heating, provides an adhesive for securely mounting the chip on the lead frame in the die-bonding step.

DETAILED DESCRIPTION OF THE INVENTION

The adhesive tape and use thereof according to the invention will now be described in detail with reference to the accompanying drawings.

Figure 1:
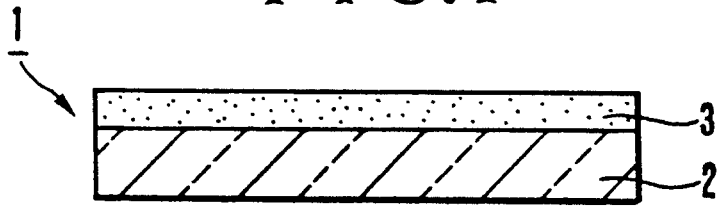
FIG. 1 is a schematic cross-sectional view of an adhesive tape according to the invention.

As schematically shown in FIG. 1, the adhesive tape 1 according to the invention comprises a base sheet 2 and an adhesive layer 3 formed on one surface of the base sheet 2. Before use of the adhesive tape it is preferable to tentatively apply a strippable release sheet (not shown) to the adhesive layer 3 for protection thereof.

It is desirable that the adhesion strength between the base sheet 2 and adhesive layer 3 is initially high and can be reduced by irradiation to a level sufficiently lower than that between the adhesive layer and a semiconductor wafer. For this purpose pose the base sheet 2 should have a surface tension not more than 40 dyne/cm, preferably not more than 38 dyne/cm. Further, suitable as the base sheet are materials which are low in electrical conductivity and excellent in water resistance as well as in heat resistance. From these viewpoints, synthetic resin films are particularly preferred. As will be stated later, the adhesive tape according to the invention, when used, is irradiated with an energy beam such as an electron beam or ultraviolet ray. When it is to be irradiated with an ultraviolet ray, it must be light transmittable, but it is not required to be light transmittable, when it is to be irradiated with an electron beam. Practically, suitable as the base sheet 2 are films of such synthetic resins as polyester, polyethylene, polypropylene, polybutene, polybutadiene, vinyl chloride ionomer, ethylenemethacrylic acid copolymer, vinyl chloride-urethane copolymer as well as cross-linked films of such resins. The films may or may not be treated with a silicone.

The base sheet 2 may be either of a single layer or laminated. The thickness of the base sheet is normally from 25 to 200 μm.

The adhesive layer 3 of the adhesive tape according to the invention comprises a (meth)acrylate polymer, an epoxy resin, a photopolymerizable low molecular weight compound, a heat activatable latent curing agent for the epoxy resin and a photopolymerization initiator for the photopolymerizable low molecular weight compound.

By the term "(meth)acrylate polymer" used herein is meant polymers primarily (at least 50 mol %) comprising structural units derived from at least one (meth)acrylate i.e. acrylate or methacrylate. Examples of the suitable (meth)acrylate include, for example, glycidyl acrylate and methacrylate as well as alkyl and hydroxyalkyl (meth)acrylates, in which the alkyl moiety has from 1 to 14 carbon atoms, such as methyl, ethyl and butyl acrylates and methacrylates, and 2-hydroxyethyl acrylate and methacrylate.

The (meth)acrylate polymer which can be used herein may be a homopolymer of a (meth)acrylate, or it may be a copolymer of at least two (meth)acrylates. Alternatively, it may be a copolymer of at least one (meth)acrylate and at least one comonomer copolymerizable therewith containing at least 50 mol % of units derived from said at least one (meth)acrylate. Examples of the comonomer include, for example, acrylic and methacrylic acid, acrylonitrile, methacrylonitrile, vinyl acetate, vinylpyrrolidones and vinyl group-containing siloxanes. Particularly preferred (meth)acrylate polymers which can be used herein are copolymers of at least one alkyl (meth)acrylate, in which the alkyl moiety has from 1 to 8 carbon atoms and at least one glycidyl (meth)acrylate containing up to 80 mol % particular from 5 to 50 mol % of units derived from said at least one glycidyl (meth)acrylate and, copolymers of at least one alkyl (meth)acrylate, in which the alkyl moiety has from 1 to 8 carbon atoms and at least one (meth)acrylic acid containing up to 50 mol %, in particular from 5 to 20 % mol on units derived from said at least one (meth)acrylic acid.

The alkyl (meth)acrylate polymer used herein is substantially free from a C—C double bond, and normally has a weight average molecular weight of from about 40,000 to about 1,500,000, preferably from about 100,000 to 1,000.000.

The epoxy resin which can be used herein is an organic material having an average of at least 1.8 vicinal epoxy groups per molecule, and normally has a weight average molecular weight of from 100 to 10000. Examples of the epoxy resin include, for example, glycidyl ethers of a phenol such as Bisphenol A, Bisphenol F, resorcinol, phenol novolac and resorcinol novolac; glycidyl ethers of a polyhydric alcohol such as butanediol, polyethylene glycol and polypropylene glycol; glycidyl esters of a polycarboxylic acid such as terephthalic acid, isophthalic acid and tetrahydrophthalic acid; N,N-diglycidyl and N-alkyl-N-glycidyl compounds of an aromatic amine such as aniline isocyanurate; and alicyclic epoxides derived from an alicyclic olefin by oxidation of its olefinic double bond or bonds, such as vinylcyclohexene diepoxide, 3,4-epoxycyclohexylmethyl-3,4-dicyclohexane carboxylate and 2-(3,4-epoxy)cyclohexyl-5,5-spiro (3,4-epoxy) cyclohexane-m-dioxane. The epoxide compounds illustrated above may be used alone or in combination. Of these, diglycidyl ethers of a bisphenol are particularly preferred. As such preferred epoxy resin those which are commercially available are "Epikote" 828 having a molecular weight of 380, "Epikote" 834 having a molecular weight of 470, "Epikote" 1001 having a molecular weight of 900, "Epikote" 1002 having a molecular weight of 1060, "Epikote" 1055 having a molecular weight of 1350 and "Epikote" 100 having a molecular weight of 2900.

The epoxy resin is used in the adhesive composition for forming the adhesive layer 3 in an amount of normally from 5 to 2000 parts by weight, preferably from 100 to 1000 parts by weight, per 100 parts by weight of the (meth)acrylate polymer.

The photopolymerizable low molecular weight compound which can be used herein is a compound having at least one carbon-carbon double bond which is crosslinkable by irradiation with an energy beam such as an ultraviolet ray and electron beam, and has a weight average molecular weight of, normally from 100 to 30,000, preferably from 300 to 10,000. Examples of preferred photopolymerizable oligomers are those having functional groups such as hydroxy and carboxy, and include, for example, urethane acrylate, epoxy acrylate, polyester acrylate, polyether acrylate, oligomer of (meth)acrylic acid and oligomer of itaconic acid. Of these, epoxy acrylate and urethane acrylate are particularly preferred.

The photopolymerizable low molecular weight compound is used in the adhesive composition for forming the adhesive layer 3 in an amount of normally from 10 to 1000 parts by weight, preferably from 50 to 600 parts by weight, per 100 parts by weight of the (meth)acrylate polymer.

The heat activatable latent curing agent for the epoxy resin is a compound having or potentially having at least two active hydrogen atoms which are inactive at ambient temperature but are activated, when heated, to react with the epoxy resin thereby effecting or promoting curing of the epoxy resin. As such a heat activatable latent curing agent for the epoxy resin, use can be made of various onium salts, in particular aliphatic and aromatic sulfonium salts, and other high melting active hydrogen-containing compounds, alone or in combination Among others, aliphatic sulfonium salt are preferred.

The amount of the heat activatable latent curing agent used in the adhesive composition for forming the adhesive layer 3 may practically be within the range from 0.1 to 50 parts by weight, preferably from 1 to 10 parts by weight, per 100 parts by weight of the epoxy resin, irrespective of the presence of any epoxy groups in the (meth)acrylate polymer and/or photopolymerizable low molecular weight compound.

In addition to the heat activatable latent curing agent for epoxide functionality, a heat curing agent such as a polyisocyanate compound may be incorporated in adhesive composition for the purpose of modifying adhesive properties of the adhesive layer. When used, the amount of the heat curing agent may be normally from 0.1 to 30 parts by weight, and preferably from 5 to 20 parts by weight, based on 100 parts by weight of the (meth)acrylate polymer.

The adhesive composition for forming the adhesive layer 3 further comprises a photopolymerization initiator for the photopolymerizable low molecular weight compound. Examples of the photopolymerization initiator include, for example, benzophenone, acetophenone, benzoin, benzoin alkyl ether, benzil and benzil dimethylketal, alone or in combination. Of these, alpha-substituted acetophenones are preferred.

The photopolymerization initiator is used in the adhesive composition for forming the adhesive layer in an amount of normally from 0.1 to 10 parts by weight, preferably from 1 to 5 parts by weight, per 100 parts by weight of the photopolymerizable low molecular weight compound.

Besides the above-mentioned components, the adhesive layer 3 may be further incorporated with a leuco dye, a light scattering inorganic compound, an expanding agent and an antistatic agent.

Examples of the leuco dye include, for example, 3-[N-(p-tolylamino)-7-anilinofluoran and 4,4', 4''-trisdimethylaminotriphenyimethane. The amount of the leuco dye, when used, is normally from 0.01 to 10 parts by weight per 100 parts by weight of the (meth)acrylate polymer.

As the light scattering agent, suitable is a fine particulate inorganic compound such as silica and alumina having a particle size of from 1 to 100 μm, preferably from 1 to 20 μm. The amount of the light scattering inorganic compound, when used, is normally from 0.1 to 10 parts by weight per 100 parts by weight of the (meth)acrylate polymer.

As the expanding agent, use can be made of higher fatty acids and derivatives thereof, silicone compounds and polyol compounds. The amount of the expanding agent, when used, is normally from 0.1 to 10 parts by weight per 100 parts by weight of the (meth)acrylate polymer.

Suitable as the antistatic agent are carbon black and anionic and cationic surfactants. The amount of the antistatic agent, when used, is normally from 0.05 to 10 parts by weight per 100 parts by weight of the (meth)acrylate polymer.

If desired, electrical conductivity may be imparted to the adhesive layer 3 by incorporating therein an electrically conductive substance such as gold, silver, copper, nickel, aluminum, stainless steel and carbon. Such an electrically conductive substance is preferably used in an amount of from 10 to 400 parts by weight based on 100 parts by weight of the (meth)acrylate polymer.

The adhesive tape according to the invention can be prepared by coating the base sheet 2 on one surface thereof with a suitable adhesive composition for forming the desired adhesive layer 3 by means of a gravure coater or a bar coater. If desired, necessary amounts of necessary components for forming the adhesive layer 3 may be dissolved or dispersed in an appropriate solvent, and the resulting composition may applied on the base sheet 2.

The thickness of the adhesive layer 3 is normally from 3 to 100 μm, and preferably from 10 to 60 μm.

The method for using the adhesive tape 1 of FIG. 1 in wafer processing will now be described. Reference numbers refer to the accompanying drawings.

Where a strippable release sheet is provided, it is first removed, and the adhesive tape 1 is placed, turning the adhesive layer 3 upward (FIG. 1).

Figure 2:
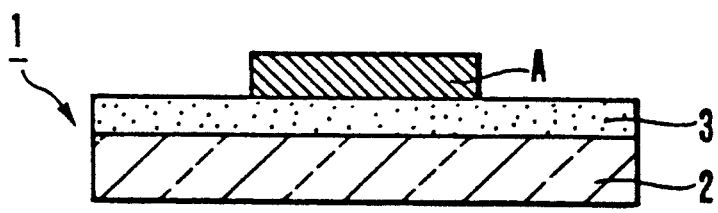
FIGS. 2 to 7 are illustrations showing states of the adhesive tape of FIG. I in various steps of a wafer processing technique which it is used.

On the face side of the adhesive layer 3 is applied a semiconductor wafer A to be processed (FIG. 2).

Figure 3:
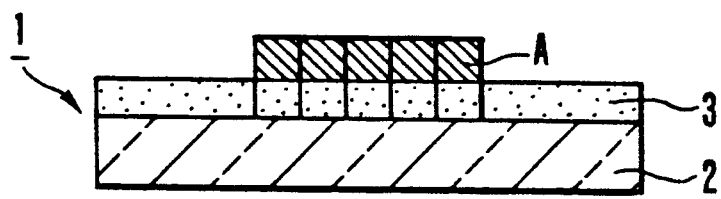

In this state the wafer A is diced together with the adhesive layer 3 of the adhesive tape 1 into chips $A_1$, $A_2$, $A_3$ and so on by a suitable dicing means such as a dicing saw (FIG. 3). In this step, the wafer A is completely diced into chips, whereas the adhesive layer 3 is substantially diced. In other words, at least 50%, preferably 100% of the whole thickness of the adhesive layer is cut. The deeper the cut, the better.

Figure 4:
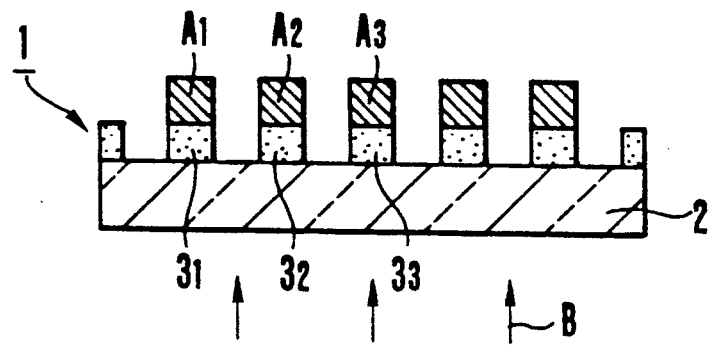

The base sheet 2 is then expanded in two perpendicularly intersecting directions within the plane of the sheet to facilitate the subsequent picking up operation (FIG. 4). While the illustrated method involves a step of expanding, this step is not always necessary. In a case wherein this stem is carried out, the base sheet 2 should naturally have extensibility in machine and transverse directions. However, base sheets having no extensibility may also be used where no expansion treatment is carried out.

Before the chips are picked up, the adhesive layer 3 is irradiated with energy beam B to polymerize or cure the photopolymerizable compound contained in the adhesive layer 3 from the side of the base sheet 2 on which the adhesive layer 3 is not formed (FIG. 4). As the energy beam ultraviolet ray having a center wave length of about 365 nm is preferred, and upon irradiation with such ultraviolet ray intensity of radiation and irradiation time are preferably set within the ranges of from 20 to 500 mW/cm$^2$ and from 0.1 to 150 seconds, respectively.

While the dicing step is carried out prior to the irradiation step in the illustrated method, the irradiation may be effected prior to the dicing, in particular where no expansion is carried out. Furthermore, while the irradiation in the illustrated method is carried out before the chips come to a pick-up station where the pick-up operation is carried out, the irradiation may be effected at the pick-up station, in particular where the expansion carried out.

When the adhesive used herein is cured by irradiation with an energy beam, its adhesion strength to the wafer is increased well above a level of its adhesion strength to the base sheet. This is believed to be due to the presence of the epoxy resin in the adhesive.

Figure 5:
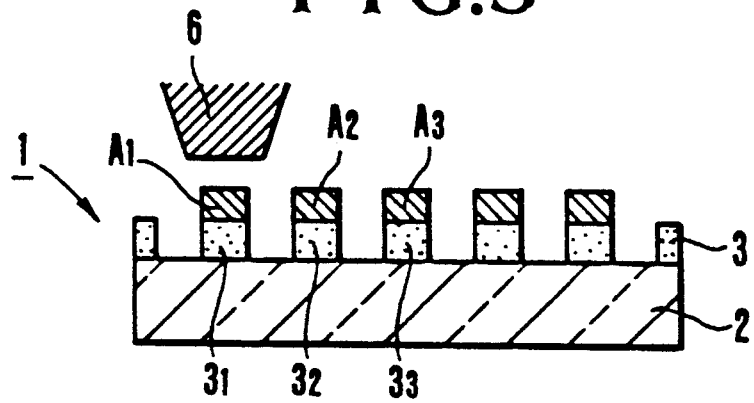
Figure 6:
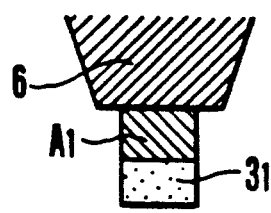

Next, in a pick-up station, the wafer chips $A_1$, $A_2$, $A_3$ and so on are successively pushed up by a pushing rod (not shown), picked up from the base sheet 2 by a suitable means, such as a vacuum collet 6, as shown in FIG. 5, and collected in a wafer box (not shown). Since the cured adhesive has a greater adhesion strength to the wafer than to the base sheet 1, the wafer chips can readily be released together with the cured adhesive attached thereto from the base sheet 1. FIG. 6 depicts the wafer chip $A_1$ picked up by the vacuum collet 6. As seen from FIG. 6, the picked up wafer chip $A_1$ carries a piece $3_1$ of the diced and irradiated adhesive layer 3. Since the cured adhesive attached to the wafer chips is no longer sticky, the wafer chips collected in the wafer box do not stick to each other.

In the illustrated method the energy beam irradiation is effected at once, but it may be done partially in several times. For instance, especially, in a case wherein the expansion of the base sheet has been carried out, only the portion of the base sheet 1 corresponding to each of the wafer chips $A_1$, $A_2$, $A_3$ and so on may be irradiated from the back side of the base sheet 1 by means of an irradiating tube, pushed up by the same tube and picked up by the vacuum collect so that the irradiation may be carried out at the pick-up station.

Figure 7:
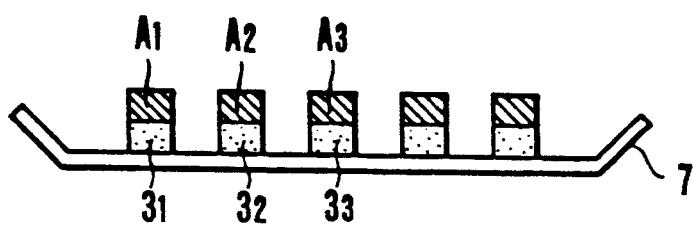

The wafer chips $A_1$, $A_2$, $A_3$ and so on are then placed on a lead frame 7 by means of a die-bonder (not shown) so that the respective pieces $3_1$, $3_2$, $3_3$ and so on of the adhesive layer may come in contact with the lead frame, and heated at a temperature of normally from 100° to 300° C., preferably from 150° to 250° C., for a period of normally from 1 to 120 minutes, preferably from 5 to 60 minutes so as to cause the cured adhesive contained in the pieces of the diced adhesive layer to again develop tackiness (FIG. 7). By this heating the adhesion strength of the adhesive layer to the wafer chip is increased to at least 1000 g/25 mm, and at the same time the wafer chips are firmly adhered to the lead frame 7 at an adhesion strength of substantially the same level. Thus, the wafer chips can be securely mounted the on lead frame 7.

In accordance with still another aspect of the invention there is provided an adhesive composition comprising a (meth)acrylate polymer having at least 50 mol % of units derived from at least one (meth)acrylate, from 5 to 2000 parts by weight, based on 100 parts by weight of the (meth)acrylate polymer, of an epoxy resin having a weight average molecular weight of from 100 to 10000, from 10 to 1000 parts by weight, based on 100 parts by weight of the (meth)acrylate polymer, of a photopolymerizable low molecular weight compound having a weight average molecular weight of from 100 to 30,000, a heat activatable latent curing agent for said epoxy resin and a photopolymerization initiator for said photopolymerizable low molecular weight compound.

The adhesive composition according to the invention provides an adhesive layer which is curable by irradiation with an energy beam and the so cured adhesive layer is capable of developing tackiness again by heating.

The invention will now be further described by the following examples, wherein parts are by weight unless otherwise specified.

EXAMPLE 1

| | |
|---|---|
| (Meth)acrylate polymer having a solid content of 35% by weight and containing a copolymer of methyl acrylate and glycidyl methacrylate, the copolymer containing 20 mol % methyl acrylate and having a molecular weight of about 300,000 | 100 parts (solid basis) |
| Bisphenol diglycidyl ether based epoxy resin having a number average molecular weight of 500 (supplied by YUKA SHELL EPOXY K. K. under a trade name of Epikote 834) | 600 parts |
| Photopolymerizable epoxy acrylate oligomer having two C—C double bonds and a molecular weight of 730 as measured by GPC using polystyrene as standard (supplied by SHIN-NAKAMURA CHEMICAL Co, Ltd. under a trade name of NK-ester EA-800) | 100 parts |
| Heat activatable latent curing agent for epoxy resins: aliphatic sulfonium salt (supplied by ASAHI DENKA KOGYO K. K. under a trade name of CP-66) | 18 parts |
| Photopolymerization initiator: 2.2-dimethoxy-2-phenylacetophenone | 5 parts |

An adhesive composition comprising the above-indicated components in indicated amounts was applied on a polyethylene film having a surface tension of 32 dyne/cm and a thickness of 100 μm, and dried under heating at 100° C. for 1 minute to prepare an adhesive tape having an adhesive layer of a thickness of 30 μm.

A silicon wafer was applied onto the adhesive layer surface of the adhesive tape so prepared. The adhesive tape adhered to the silicon wafer at an adhesion strength of 360 g/25 mm, as measured in accordance with JIS Z 0237. The adhesive layer was then irradiated with 200 mW/cm² of an ultraviolet ray for 2 seconds using a 80 W/cm high pressure mercury lamp. By this irradiation the adhesion strength between the adhesive layer and the silicon wafer increased to 900 g/25 mm, while the adhesion strength between the adhesive layer and the polyethylene base sheet after the irradiation was 60 g/25 mm.

The adhesive tape was employed in processing a silicon wafer as follows. A silicon wafer of the same quality having a diameter of 5 inches was applied onto the adhesive layer of the tape, and fully cut together with the adhesive layer by means of a dicing saw supplied by DISCO Co., Lid.at a cutting rate of 50 mm/sec into 5 mm square IC chips. The adhesive layer was irradiated through the polyethylene base sheet with the above-mentioned ultraviolet ray for 2 seconds. The IC chips were picked up and then directly placed on a lead frame by means of a die-bonder so that pieces of the cured adhesive layer attached to the chips may come in contact with the lead frame. The chips were then heated at a temperature of 170° C. for a period of 30 minutes whereby they could be securely mounted on the lead frame.

EXAMPLE 2

| | |
|---|---|
| (Meth)acrylate polymer having a solid content of 35% by weight and containing a copolymer of butyl acrylate and acrylic acid, the copolymer containing 80 mol % of butyl acrylate and having a molecular weight of about 500,000 | 100 parts (solid basis) |
| Bisphenol diglycidyl ether based epoxy resin having a solid content of 30% by weight and a number average molecular weight of 900 (supplied by YUKA SHELL EPOXY K. K. under a trade name of Epikote 1001) | 400 parts (solid basis) |
| Photopolymerizable urethane acrylate oligomer having two C—C double bonds and a molecular weight of 5,000 as measured by GPC using polystyrene as standard (supplied by DAINICHISEIKA COLOR & MFG. CO., LTD. under a trade name of 14–33) | 70 parts |
| Heat activatable latent curing agent for epoxy resins: aliphatic sulfonium salt (supplied by ASAHI DENKA KOGYO K. K. under a trade name of CP-66) | 8 parts |
| Photopolymerization initiator: 2.2-dimethoxy-2-phenylacetophenone | 5 parts |
| Heat curing agent: aromatic polyisocyanate (supplied by TOYO INK MFG. CO. LTD. under a trade name of BHS-8515) | 5 parts |

| | |
|---|---|
| Electrically conductive filler: particulate nickel having a particle size of 5 μm | 750 parts |

An adhesive composition comprising the above-indicated components in indicated amounts was applied on a polypropylene film having a surface tension of 35 dyne/cm and a thickness of 60 μm, and dried under heating at 100° C. for 1 minute to prepare an adhesive tape having an adhesive layer of a thickness of 30 μm.

A silicon wafer was applied onto the adhesive layer surface of the adhesive tape so prepared. The adhesive tape adhered to the silicon wafer at an adhesion strength of 150 g/25 μmm. The adhesive layer was then irradiated with an ultraviolet ray as in Example 1. By this irradiation the adhesion strength between the-adhesive layer and the silicon wafer increased to 500 g/25 mm, while the adhesion strength between the adhesive layer and the polypropylene base sheet after the irradiation was to 40 g/25 mm.

The adhesive tape was employed in processing a silicon wafer in the manner as described in Example 1. Good results were obtained as in Example 1.

Effect of the Invention

The adhesive layer of the adhesive tape according to the invention can be cured by irradiation with an energy beam, and the so cured adhesive layer is capable of developing tackiness again by heating. Furthermore, the adhesive tape has such a unique property that when it is adhered to a semiconductor wafer and irradiated with an energy beam, the adhesion strength of the adhesive layer to the wafer becomes much higher than that to the base sheet. These properties of the adhesive tape according to the invention can be advantageously utilized in processing a semiconductor wafer according to the invention.

In the method according to the invention, the adhesive tape according to the invention serves as a dicing tape for holding the wafer in position during the dicing step. Each piece of the diced and cured adhesive layer, that is attached to each chip and capable of being tackified by heating, provides an adhesive required for securely mounting the chip on the lead frame in the die-bonding step. Thus, the invention has solved the problems associated with the prior art including removal of any residual adhesive from diced IC chips and adequate provision of a separate adhesive to the IC chips.

Modification of the Invention

According to one modification of the invention there is provided an adhesive tape comprising an adhesive layer composed of a (meth)acrylate polymer, an epoxy resin, a photopolymerizable low molecular weight compound, a heat activatable latent curing agent for said epoxy resin and a photopolymerization initiator for said photopolymerizable low molecular weight compound.

Figure 8:
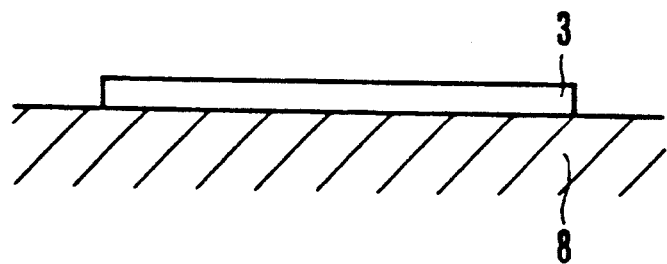
FIG. 8 is a cross-sectional view of a modification of the adhesive tape of FIG. 1

Such a base sheet free adhesive tape can be readily prepared by forming the adhesive layer 3 on a release base 8 (FIG. 8), and can also be used in processing a semiconductor wafer. Normally, a base sheet free adhesive tape is supplied to customers in a form sandwiched between a pair of release sheets. Upon use thereof in wafer processing, one of the release sheets is removed to expose the adhesive layer 3; a semiconductor wafer to be processed is adhered to the adhesive layer; the adhesive layer is irradiated with an energy beam transmitted through the remaining release sheet; the wafer is diced into chips together with the adhesive layer; the chips are picked up together with pieces of the irradiated and diced adhesive layer from the release sheet and placed on a lead frame so that the respective pieces of the adhesive layer adhered thereto may come in contact with said lead frame; and the pieces of the diced adhesive layer are caused to again develop tackiness by heating, thereby securely mounting the chips on said lead frame.

Thus, according to another modification of the invention there is provided a method for using an adhesive tape comprising an adhesive layer composed of a (meth)acrylate polymer, an epoxy resin, a photopolymerizable low molecular weight compound, a heat activatable latent curing agent for said epoxy resin and a photopolymerization initiator for said photopolymerizable low molecular weight compound, said method comprising the steps of adhering a semiconductor wafer to said adhesive tape formed on a release sheet, irradiating the adhesive layer with an energy beam dicing said wafer into chips together with the adhesive layer, picking up the chips together with pieces of the diced adhesive layer adhered thereto from said release sheet, placing the chips together with pieces of the diced adhesive layer adhered thereto on a lead frame so that the respective pieces of the adhesive layer may come in contact with said lead frame, and causing the pieces of the diced adhesive layer to again develop tackiness by heating, thereby securely mounting the chips on said lead frame.

What is claimed is:

1. An adhesive composition for forming an adhesive layer which is curable by irradiation with an energy beam and wherein the so cured adhesive layer is capable of developing tackiness again by heating, said composition consisting essentially of:
   (a) 100 parts by weight of a (meth)acrylate polymer substantially free from C—C double bonds and having at least 50 mol % of units derived from at least one (meth)acrylate and a weight average molecular weight of from about 40,000 to 1,500,000;
   (b) from 400 to 2,000 parts by weight of an epoxy resin having an average of at least 1.8 vicinal epoxy groups per molecule and a weight average molecular weight of from 100 to 10,000;
   (c) from 10 to 1,000 parts by weight of a photopolymerizable low molecular weight compound having at least one C—C double bond and having a weight average molecular weight of from 100 to 30,000;
   (d) a heat activatable latent curing agent for said epoxy resin; and
   (e) a photopolymerization initiator for said photopolymerizable low molecular weight compound.

* * * * *

UNITED STATES PATENT AND TRADEMARK OFFICE
CERTIFICATE OF CORRECTION

PATENT NO. : 5,356,949
DATED : October 18, 1994
INVENTOR(S) : Mikio KOMIYAMA, Yasunao MIYAZAWA, Kazuyoshi EBE and Takanori SAITO

It is certified that error appears in the above-indentified patent and that said Letters Patent is hereby corrected as shown below:

Column 1, line 29, before "is" insert --it--; and line 39, delete the comma (",").

Column 3, line 11, after "chloride" insert a comma (--,--);

line 52, change "(meth)acrylate and," to --(meth)acrylate, and--; and line 56, change "% mol on" to --mol % of--.

Column 4, line 22, change "100" to --1007--; and line 59, change "tion Among" to --tion. Among--, and change "salt" to --salts--.

CONTINUED

UNITED STATES PATENT AND TRADEMARK OFFICE
CERTIFICATE OF CORRECTION

PATENT NO. : 5,356,949
DATED : October 18, 1994
INVENTOR(S) : Mikio KOMIYAMA, Yasunao MIYAZAWA, Kazuyoshi EBE and Takanori SAITO It is certified that error appears in the above-indentified patent and that said Letters Patent is hereby corrected as shown below:

Column 5, line 30, change "thylaminotriphenyimethane" to --thylaminotriphenylmethane--; and line 67, after "may" insert --be--.

Column 6, line 24, change "stem" to --step--; and line 47, after "expansion" insert --is--.

Column 7, line 26, change "the on" to --on the--.

Signed and Sealed this

Second Day of May, 1995

Attest:

BRUCE LEHMAN

Attesting Officer  Commissioner of Patents and Trademarks